(12) United States Patent
Jain et al.

(10) Patent No.: US 11,843,924 B2
(45) Date of Patent: Dec. 12, 2023

(54) METHODS AND SYSTEMS FOR GAIN ALIGNMENT IN MULTIPLE DEVICES WITH REDUCED LATENCY

(71) Applicant: Texas Instruments Incorporated, Dallas, TX (US)

(72) Inventors: Prateek Jain, Chandigarh (IN); Matthew Raymond Kucic, Santa Clara, CA (US); Sahiti Priya Chittam, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 331 days.

(21) Appl. No.: 17/147,259

(22) Filed: Jan. 12, 2021

(65) Prior Publication Data

US 2021/0219054 A1   Jul. 15, 2021

Related U.S. Application Data

(60) Provisional application No. 62/960,162, filed on Jan. 13, 2020.

(51) Int. Cl.
*H03G 7/00*     (2006.01)
*H04R 3/00*     (2006.01)
*H03G 3/30*     (2006.01)
*H03F 3/217*    (2006.01)
*H03F 99/00*    (2009.01)

(52) U.S. Cl.
CPC ............. *H04R 3/007* (2013.01); *H03F 3/217* (2013.01); *H03G 3/3005* (2013.01); *H04R 2430/01* (2013.01)

(58) Field of Classification Search
CPC ..... H04R 3/007; H04R 2430/01; H03F 3/217; H03G 3/3005
USPC .................................................. 381/106, 120
See application file for complete search history.

(56) References Cited

U.S. PATENT DOCUMENTS

2022/0360901 A1* 11/2022 Healy .................. H03G 3/3005

* cited by examiner

*Primary Examiner* — Ammar T Hamid
(74) *Attorney, Agent, or Firm* — John R. Pessetto; Frank D. Cimino

(57) ABSTRACT

Methods and systems for aligning amplification gains in a plurality of interconnected devices are disclosed. The method includes receiving by each device limiter gain attenuations and brownout gain attenuations broadcasted by the plurality of devices and selecting the maximum brownout gain attenuation and the maximum limiter gain attenuation. The method includes determining a total attenuation as a sum of the maximum brownout attenuation gain and the maximum limiter attenuation gain. The method includes receiving a frame synchronization signal and adjusting the amplification gain by applying the total attenuation responsive to the frame synchronization signal.

28 Claims, 3 Drawing Sheets

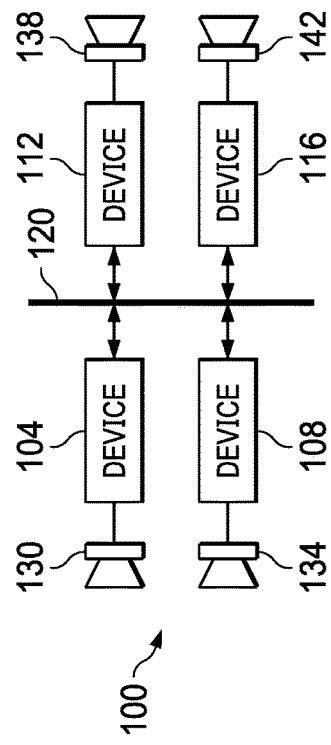
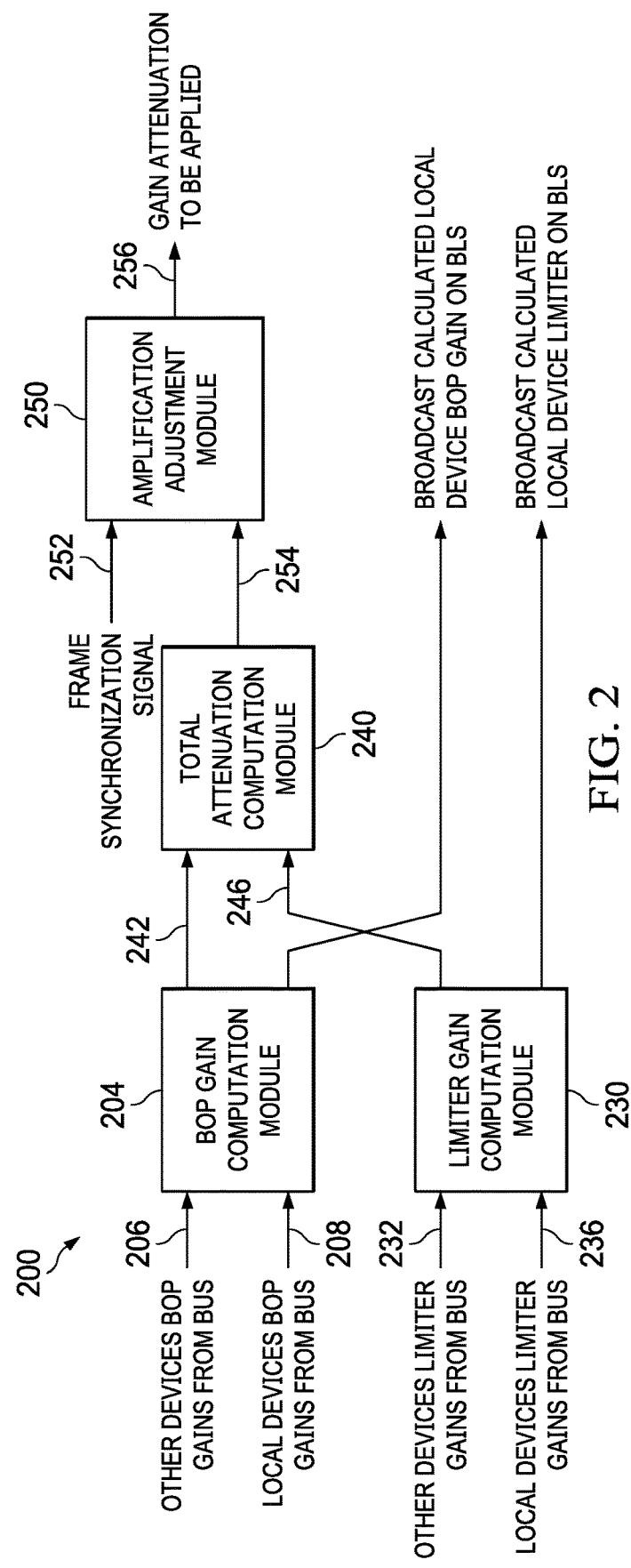

METHODS AND SYSTEMS FOR GAIN ALIGNMENT IN MULTIPLE DEVICES WITH REDUCED LATENCY

CROSS REFERENCE TO RELATED APPLICATION

This application claims priority to U.S. provisional application No. 62/960,162, filed Jan. 13, 2020, entitled "Generic Architecture for Inter-Chip Gain Alignment with Reduced Chip to Chip Gain Alignment Latency", which is hereby incorporated by reference herein.

BACKGROUND

This description relates to methods and systems for gain alignment in multiple devices.

DESCRIPTION OF THE RELATED ART

In multi-channel audio systems, multiple devices such as audio amplifiers receive input signals (e.g., audio streams) from a source. The devices are coupled to output transducers such as speakers. The devices generally include one or more amplification stages for amplifying the audio streams. The amplified audio streams are fed to output transducers. The amplification stages may include a variable gain amplification stage which may, for example, apply limiter gains, brownout gains and thermal gains.

In existing systems, gains applied to the audio streams are not aligned and synchronized by the devices. As a consequence, latency and variation of gain application among the devices exist which degrades performance.

SUMMARY

In one aspect, a method includes receiving by a first device limiter gain attenuations and brownout gain attenuations broadcasted by a plurality of devices and selecting the maximum brownout gain attenuation and the maximum limiter gain attenuation. The method includes determining a local brownout gain attenuation based on a supply voltage level and a minimum supply voltage threshold. The method includes determining a local limiter gain attenuation based on the supply voltage level and an input signal amplitude. The method includes determining a total attenuation as a sum of the maximum brownout gain attenuation and the maximum limiter gain attenuation. The method includes receiving by the first device a frame synchronization signal and adjusting the amplification gain by applying the total attenuation responsive to the frame synchronization signal.

In an additional aspect, the method includes receiving by the first device the limiter gain attenuations and brownout gain attenuations broadcasted by the plurality of devices in respective time division multiplex (TDM) slots.

In an additional aspect, the method includes applying by the first device the total attenuation to the amplification gain upon an occurrence of a rising edge of the frame synchronization signal.

In an additional aspect, the limiter gain attenuation is determined based on a difference between the supply voltage level and the input signal amplitude, and the brownout gain attenuation is determined based on a difference between the supply voltage level and the minimum supply voltage threshold.

In an additional aspect, a system for aligning amplification gains in a plurality of interconnected devices includes a brownout gain computation module configured to receive brownout gain attenuations broadcasted by the plurality of devices. The brownout gain computation module is configured to select the maximum brownout gain attenuation. The brownout gain computation module is configured to compare a supply voltage level and a minimum supply voltage threshold and to determine a local brownout gain attenuation based on the comparison. The system includes a limiter gain computation module configured to receive limiter gain attenuations broadcasted by the plurality of devices. The limiter gain computation module is configured to select the maximum limiter gain attenuation from the broadcasted limiter gain attenuations. The limiter gain computation module is configured to compare a supply voltage level and an input signal amplitude to determine a local limiter gain attenuation based on the comparison. The system includes a total attenuation computation module configured to receive the brownout gain attenuation and the limiter gain attenuation and to determine a total attenuation based on the brownout gain attenuation and the limiter gain attenuation. The system includes an amplification adjustment module configured to receive a frame synchronization signal and the total attenuation. The amplification adjustment module is configured to adjust the amplification gain by applying the total attenuation responsive to the frame synchronization signal.

BRIEF DESCRIPTION OF THE DRAWINGS

FIG. 1 is a block diagram of a multi-channel audio system of an example embodiment.

FIG. 2 is a block diagram of a system for aligning and synchronizing amplification gains of an example embodiment.

DETAILED DESCRIPTION

Figure 3:
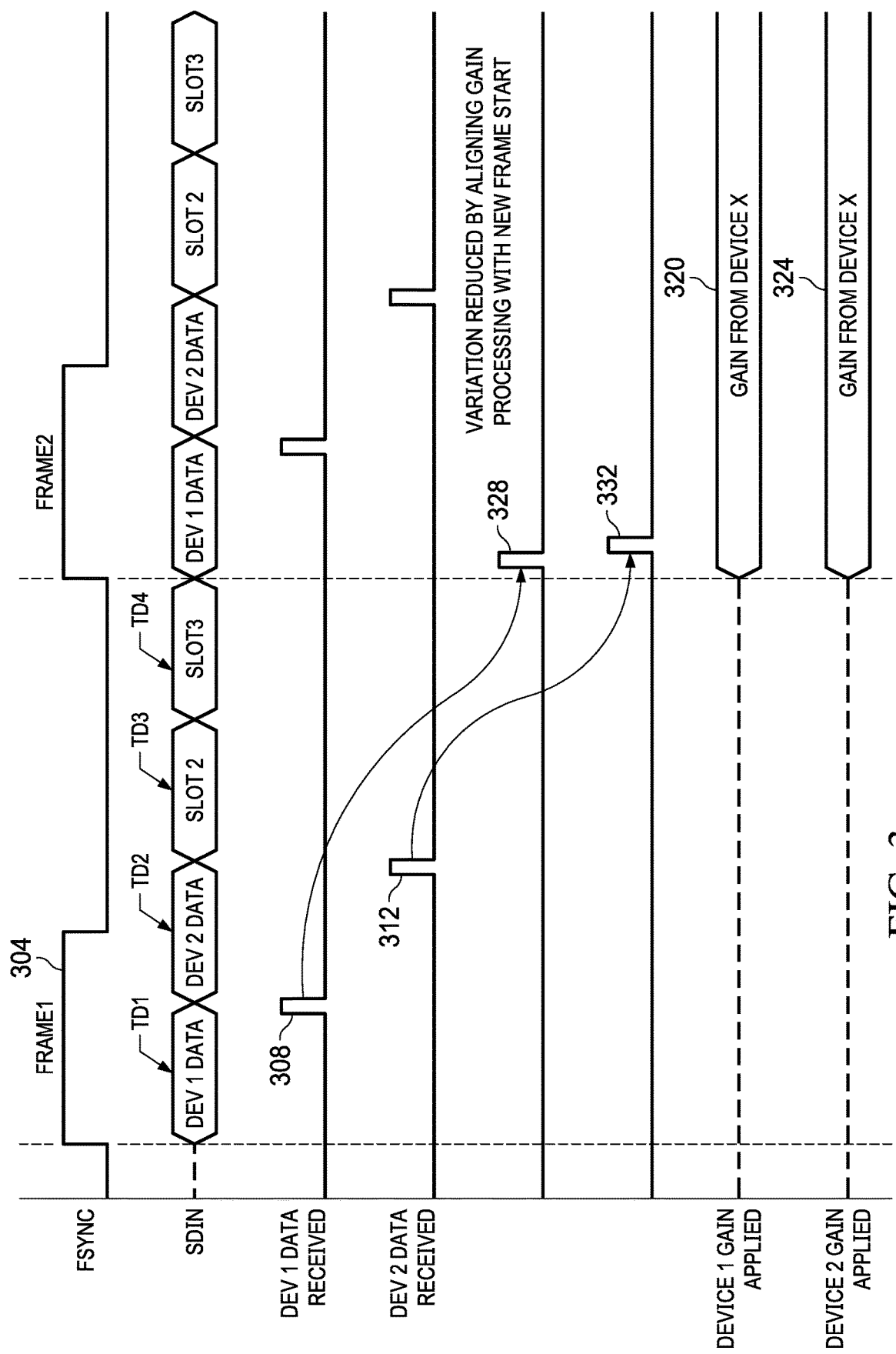
FIG. 3 are timing diagrams of waveforms in the system of FIG. 1.

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

FIG. 1 is a block diagram of a multi-channel audio system 100 of an example embodiment. The system 100 includes devices 104, 108, 112 and 116 interconnected by a bus 120. The devices 104, 108, 112 and 116 may be pulse width modulated (PWM) amplifiers (e.g., class-D amplifiers) configured to receive input signals (e.g., audio streams) broadcasted on the bus 120. The devices 104, 108, 112 and 116 are coupled via separate channels to respective output transducers 130, 134, 138 and 142 (e.g., speakers). The devices 104, 108, 112 and 116 include one or more amplification stages (not shown in FIG. 1) which feed the output transducers. The amplification stages may include a variable gain amplification stage which may, for example, apply limiter gains (also referred to herein as limiter gain attenuation), brownout gains (also referred to herein as brownout gain attenuation) and thermal gains.

In an example embodiment, the devices 104, 108, 112 and 116 align and synchronize amplification gain attenuations with each other for reduced gain alignment latency and improved performance. The devices 104, 108, 112 and 116 broadcast respective limiter gain attenuations and brownout gain attenuations on the bus 120. A limiter gain attenuation is applied by an analog gain control (AGC) of an amplifier to limit the gain when the amplitude of an input signal rises above a supply voltage to reduce signal distortion. When the amplitude of an input signal (e.g., audio stream) rises above a supply voltage, the output signal is clipped. The limiter gain attenuation is applied by the AGC to reduce or limit the amplifier gain to prevent the output signal from being clipped, thus preventing signal distortion. When the limiter gain attenuation is increased, it is referred to as a limiter gain attack, and when the limiter gain attenuation is decreased, it is referred to as a limiter gain release. A brownout gain attenuation is applied to reduce an amplifier gain to prevent a brownout due to a drop in a supply voltage. As the supply voltage falls, the current draw in a switched-mode amplifier increases to maintain the same output voltage, until such a point the amplifier malfunctions. The brownout gain attenuation reduces the amplifier gain when the supply voltage falls below a threshold, thus reducing the current draw. When the brownout gain attenuation is increased, it is referred to as brownout gain attack, and when the brownout gain attenuation is decreased, it is referred to as a brownout gain release.

With continuing reference to FIG. 1, the devices 104, 108, 112 and 116 broadcast their limiter gain attenuations and brownout gain attenuations on the bus 120. The devices 104, 108, 112 and 116 monitor the bus 120 and extract the limiter gain attenuations and the brownout gain attenuations broadcasted by all devices. The devices then determine their local brownout attenuation and local limiter attenuation based on the broadcasted limiter gain attenuations and brownout gain attenuations. A total attenuation is determined as the sum of the maximum value of brownout gain attenuation and the maximum value of limiter gain attenuation of all the devices. In response to a frame synchronization signal, the devices 104, 108, 112 and 116 apply the total attenuation to adjust their amplifier gains. Since the frame synchronization signal is received by the devices 104, 108, 112 and 116 at approximately same time, amplification gain adjustment by the devices 104, 108, 112 and 116 are synchronized, thereby reducing latency among the devices.

FIG. 2 is a block diagram of a system 200 for aligning and synchronizing amplification gains of an example embodiment. The system 200 can be implemented in the devices 104, 108, 112 and 116 with, for example, an FPGA, an ASIC, a microprocessor, or software.

With continuing reference to FIG. 2, the system 200 includes a brownout power gain computation module 204 having a first input 206 configured to receive brownout gain attenuations broadcasted by the other devices (e.g., devices 108, 112 and 116) and having a second input 208 configured to receive the brownout gain attenuation from the local device (e.g., device 104). The first and second inputs 206 and 208 are coupled to the communication bus 120 (not shown in FIG. 2) on which the brownout gain attenuations are broadcasted by the devices in time division multiplex (TDM) slots. The brownout gain computation module 204 is configured to read the broadcasted brownout gain attenuations in the TDM slots and select the maximum brownout gain attenuation from the broadcasted brownout gain attenuations. Also, the brownout gain computation module is configured to compare a supply voltage level and a minimum supply voltage threshold and to determine a local brownout gain attenuation based on the comparison, which is then broadcast on the communication bus 120 in the TDM slot of the device. The brownout attenuation is used to reduce the amplifier gain to prevent a brownout due to a drop in a supply voltage. In one embodiment, the brownout gain computation module 204 is configured to determine the brownout gain attenuation based on a difference between the supply voltage and the minimum supply voltage threshold.

With continuing reference to FIG. 2, the system 200 includes a limiter gain computation module 230 having a first input 232 coupled to receive limiter gain attenuations broadcasted by the other devices and having a second input 236 coupled to receive the limiter gain attenuation from the local device.

The first and second inputs 232 and 236 are coupled to the communication bus 120 on which the limiter gains are broadcasted by the devices in TDM slots. The limiter gain computation module 230 is configured to read the broadcasted limiter gain attenuations in the TDM slots and select the maximum limiter gain attenuation from the broadcasted limiter gain attenuations. Also, the limiter gain computation module 230 is configured to compare a supply voltage level and an input signal (e.g., audio stream) amplitude to determine a local limiter gain attenuation based on the comparison, which is broadcast on the communication bus 120 in the TDM slot of the device. When the amplitude of an input signal rises above a supply voltage, the output signal is clipped. The limiter gain attenuation is applied by an AGC (not shown in FIG. 2) to reduce or limit the amplifier gain in order to prevent the output signal from being clipped, thus preventing signal distortion. In one embodiment, the limiter gain computation module 230 is configured to determine the local limiter attenuation based on a difference between the supply voltage and the peak amplitude of the input signal.

With continuing reference to FIG. 2, the system 200 includes a total attenuation computation module 240 having a first input 242 coupled to receive the brownout gain attenuation and having a second input 246 coupled to receive the limiter gain attenuation. The total attenuation computation module 240 is configured to determine a total attenuation based on the brownout attenuation and the limiter attenuation. In an example embodiment, the total attenuation is the sum of the maximum brownout gain attenuation and the maximum limiter gain attenuation. The total attenuation may have a positive or a negative value, and thus the total attenuation may have a net effect of increasing or decreasing the amplifier gain.

With continuing reference to FIG. 2, the system 200 includes an amplification adjustment module 250 having a first input 252 configured to receive a frame synchronization signal and having a second input 254 configured to receive the total attenuation. The amplification adjustment module 250 is configured to adjust the amplification gain 256 by applying the total attenuation responsive to the frame synchronization signal. Depending on the total attenuation value, the amplification gain may be increased or decreased. By way if example, a system may have 4 devices: devices #1-#4. The devices #1-#4 compute their respective limiter gain attenuation and brownout gain attenuation values.

Device #1: limiter gain attenuation=0 dB; brownout gain attenuation=4 dB

Device #2: limiter gain attenuation=6 dB; brownout gain attenuation=0 dB

Device #3: limiter gain attenuation=0 dB; brownout gain attenuation=0 dB

Device #4: limiter gain attenuation=5 dB, brownout attenuation=3 dB

Each device broadcasts its local limiter gain attenuation and its local brownout gain attenuation values on the communication bus 120 in its TDM slot. All devices receive the gain attenuation values and compute the maximum limiter gain attenuation value (6 dB) and the maximum brownout gain attenuation value (4 dB). The total attenuation (10 dB) is computed by each device. Each device then applies the total attenuation (10 dB) to its own audio stream when the next frame synchronization signal is received.

Variations to the system 200 within the scope of the present disclosure are possible. For example, the system 200 can be modified to enable each device to receive and extract other gain information broadcasted by the devices on the bus. For example the system 200 can be modified to allow each device to receive and extract thermal gains broadcasted by all devices on the bus and adjust amplification gain based on the thermal gains as well.

FIG. 3 are timing diagrams of waveforms in the system 100. The system 100 generates a frame synchronization signal 304 having frames that are broadcasted on the communication bus 120. For illustration purposes, the frame synchronization signal 304 is shown having FRAME1 and FRAME2. The frames FRAME1 and FRAME2 are each divided into four time division multiplex (TDM) slots (e.g., TD1, TD2, TD3 and TD4), each TDM slot being reserved for one of four devices. The devices monitor the bus 120 for the frame synchronization signal 304 and the TDM slots. Upon occurrence of FRAME1, the devices 104, 108, 112 and 116 broadcast limiter gain attenuations and brownout gain attenuations in their respective TDM slots on the bus. Also, the devices extract gain information associated with other devices from the TDM slots.

In an example embodiment, at the end of TD1 slot, a pulse 308 is generated to indicate data broadcasted by device #1 is successfully extracted by all other devices. Similarly, at the end of the TD2, a pulse 312 is generated to indicate data broadcasted by device #2 is successfully extracted by all other devices. Next, upon occurrence of FRAME2, device #1 and device #2 begin to adjust their amplification gains by applying the computed total attenuation (indicated by time slots 320 and 324). The other devices (not shown in FIG. 3) in the system 100 also adjust their amplification gains similarly.

Variations to the system 100 within the scope of the present disclosure are possible. For example, a pulse 328 may be generated within device #1, and in response device #1 adjusts its amplification gain 320, and a pulse 332 may be generated within device #2, and in response device #2 adjusts its amplification gain 324. Any offset between the pulses 328 and 332 is caused by variation in signal propagation time in the devices. Thus, the devices do not adjust their amplification gains upon extraction of the gain information from the TDM slots but delay until the occurrence of the next frame (i.e., FRAME2) at which time all the devices adjust their amplification gains approximately concurrently. As a result, gain attenuation in the devices are balanced and synchronized and latency is reduced.

Figure 4:
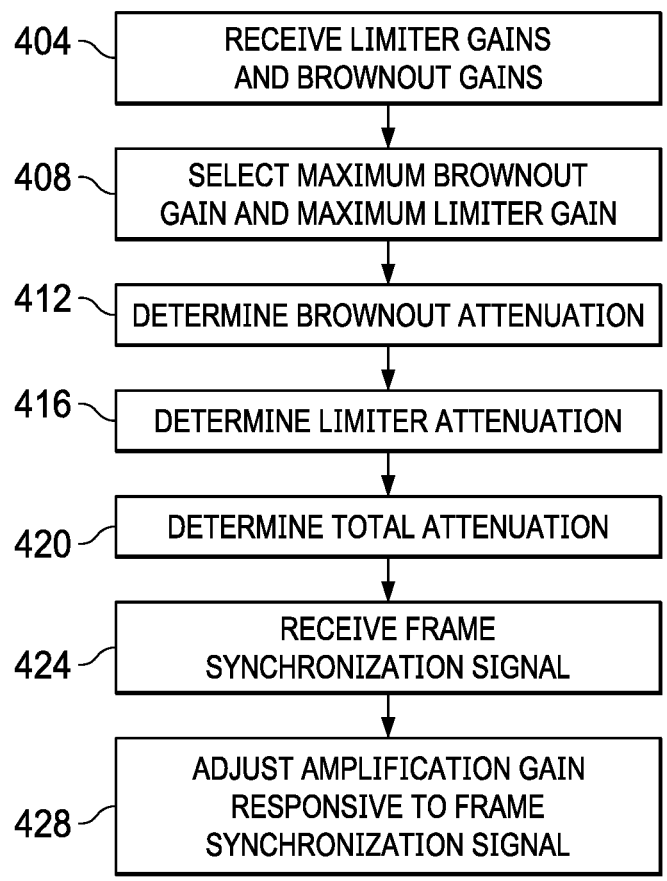
FIG. 4 is a flow diagram of a method of an example embodiment.

FIG. 4 is a flow diagram of a method of aligning amplification gain attenuations in a plurality of interconnected devices. In block 404, limiter gain attenuations and brownout gain attenuations are received by a plurality of devices in TDM slots. In a block 408, the maximum brownout gain attenuation and the maximum limiter gain attenuation are selected by the devices. In a block 412, a local brownout gain attenuation is determined based on a supply voltage level, a minimum supply voltage threshold and the maximum brownout gain. In a block 416, a local limiter gain attenuation is determined based on the supply voltage level and an input signal peak amplitude. In a block 420, a total attenuation is determined. In a block 424, a frame synchronization signal is received, and in a block 428 the devices adjust amplification gains by applying the total attenuation responsive to the frame synchronization signal.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A method of aligning amplification gains in a plurality of interconnected devices, the method comprising:
   receiving by a first device limiter, gain attenuations and brownout gain attenuations broadcasted by the plurality of devices;
   selecting a first brownout gain attenuation and a first limiter gain attenuation from the broadcasted brownout gain attenuations and limiter gain attenuations;
   determining a local brownout attenuation based on a supply voltage and a first supply voltage threshold;
   determining a local limiter attenuation based on the supply voltage level and an input signal amplitude;
   determining a total attenuation as a sum of the first brownout gain attenuation and the first limiter gain attenuation; and
   receiving by the first device a frame synchronization signal and adjusting amplification gain by applying the total attenuation responsive to the frame synchronization signal.

2. The method of claim 1, further comprising receiving by the first device, the limiter gain attenuations and brownout gain attenuations broadcasted by the plurality of devices in respective time division multiplex (TDM) slots.

3. The method of claim 1, further comprising applying by the first device, the total attenuation to the amplification gain upon an occurrence of a rising edge of the frame synchronization signal.

4. The method of claim 1, further comprising broadcasting the local brownout gain attenuation and the local limiter gain attenuation by the first device on a TDM slot.

5. The method of claim 1, wherein the local limiter gain attenuations and local brownout gain attenuations are broadcasted by the devices on a communication bus.

6. The method of claim 1, wherein the limiter gain attenuation is determined based on a difference between the supply voltage level and the input signal amplitude.

7. The method of claim 1, wherein the brownout gain attenuation is determined based on a difference between the supply voltage and the first supply voltage threshold.

8. The method of claim 1, further comprising receiving by the plurality of devices the frame synchronization signal and applying by the plurality of devices the total attenuation to the amplification gain responsive to the frame synchronization signal.

9. The method of claim 1, wherein the devices are pulse width modulated (PWM) amplifiers.

10. The method of claim 1, wherein the input signal is an audio stream.

11. A method of aligning amplification gains in a plurality of interconnected devices, the method comprising:
receiving by the plurality of interconnected devices limiter gain attenuations and brownout gain attenuations broadcasted by the devices;
selecting by the plurality of interconnected devices a first brownout gain attenuation and a first limiter gain attenuation from the broadcasted brownout gains and limiter gains;
determining by the plurality of interconnected devices a local brownout gain attenuation based on a supply voltage and a first supply voltage threshold;
determining by the plurality of interconnected devices a local limiter gain attenuation based on the supply voltage and an input signal amplitude;
determining by the plurality of interconnected devices a total attenuation as a sum of the first brownout gain attenuation and the first limiter gain attenuation; and
receiving by the plurality of interconnected devices a frame synchronization signal and adjusting amplification gain by applying the total attenuation responsive to the frame synchronization signal.

12. The method of claim 11, further comprising receiving by the devices the limiter gain attenuations and brownout gain attenuations broadcasted by the devices in respective time division multiplex (TDM) slots.

13. The method of claim 11, further comprising applying by the devices the total attenuation to the amplification gain upon an occurrence of a rising edge of the frame synchronization signal.

14. The method of claim 11, further comprising broadcasting the local limiter gain attenuation and the local brownout gain attenuation by the devices.

15. The method of claim 11, wherein the limiter gain attenuation is determined based on a difference between the supply voltage and the input signal amplitude.

16. The method of claim 11, wherein the brownout gain attenuation is determined based on a difference between the supply voltage and the first supply voltage threshold.

17. The method of claim 11, wherein the devices are pulse width modulated (PWM) amplifiers.

18. A system comprising:
a brownout gain computation module having a plurality of inputs, and first and second outputs;
a limiter gain computation module having a plurality of inputs, and first and second outputs;
a total attenuation computation module having a first input, a second input and an output, wherein the first input is coupled to the first output of the brownout gain computation module and wherein the second input is coupled to the first output of the limiter gain computation module; and
an amplification adjustment module having a first input, a second input and an output; wherein the first input is configured to receive a frame synchronization signal and the second input is coupled to the output of the a total attenuation computation module.

19. The system of claim 18, wherein the brownout gain computation module is configured to receive brownout gain attenuations broadcasted by a plurality of devices at a portion of the plurality of inputs.

20. The system of claim 18, wherein the amplification adjustment module applies a total attenuation signal at the output of the amplification adjustment module upon an occurrence of a rising edge of a frame synchronization signal.

21. The system of claim 18 wherein the limiter gain attenuation module is configured to determine a limiter gain attenuation based on a difference between a supply voltage and a voltage applied at an input of the limiter gain attenuation module.

22. The system of claim 18, wherein the brownout gain computation module is configured to determine a brownout gain attenuation based on a difference between a supply voltage and a first supply voltage threshold.

23. The system of claim 18, wherein the amplification adjustment module is configured to delay adjusting amplification gain by applying a total attenuation until an occurrence of a rising edge of a frame synchronization signal.

24. The system of claim 19, wherein the devices are pulse width modulated (PWM) amplifiers.

25. The system of claim 18, wherein at least one of the plurality of inputs is an audio stream.

26. The system of claim 19, wherein the brownout gain computation module is configured to select a first brownout gain attenuation from the broadcasted brownout gain attenuations.

27. The system of claim 18, wherein the brownout gain computation module is configured to compare a supply voltage and a first supply voltage threshold to determine a local brownout gain attenuation based on the comparison.

28. The system of claim 18, wherein the total attenuation computation module deterimines a total attenuation signal at the output of the total attenuation module.

* * * * *